United States Patent
Hong et al.

(10) Patent No.: US 11,685,649 B2
(45) Date of Patent: Jun. 27, 2023

(54) CAPPING PLATE FOR PANEL SCALE PACKAGING OF MEMS PRODUCTS

(71) Applicant: Obsidian Sensors, Inc., San Diego, CA (US)

(72) Inventors: John Hong, San Diego, CA (US); Tallis Chang, San Diego, CA (US); Edward Chan, San Diego, CA (US); Bing Wen, San Diego, CA (US); Yaoling Pan, San Diego, CA (US); Kenji Nomura, San Diego, CA (US)

(73) Assignee: Obsidian Sensors, Inc., San Diego, CA (US)

( * ) Notice: Subject to any disclaimer, the term of this patent is extended or adjusted under 35 U.S.C. 154(b) by 278 days.

(21) Appl. No.: 16/982,519

(22) PCT Filed: Mar. 20, 2019

(86) PCT No.: PCT/US2019/023227
§ 371 (c)(1),
(2) Date: Sep. 18, 2020

(87) PCT Pub. No.: WO2019/183259
PCT Pub. Date: Sep. 26, 2019

(65) Prior Publication Data
US 2021/0002130 A1    Jan. 7, 2021

Related U.S. Application Data

(60) Provisional application No. 62/645,687, filed on Mar. 20, 2018.

(51) Int. Cl.
*B81C 1/00* (2006.01)
*B81B 7/00* (2006.01)
*G01J 5/20* (2006.01)

(52) U.S. Cl.
CPC ........ *B81C 1/00269* (2013.01); *B81B 7/0038* (2013.01); *B81C 1/00285* (2013.01);
(Continued)

(58) Field of Classification Search
CPC ............ B81C 1/00269; B81C 1/00285; B81C 2203/0118; B81C 2203/019;
(Continued)

(56) References Cited

U.S. PATENT DOCUMENTS 5,705,079 A    1/1998  Elledge
7,528,000 B2 *  5/2009  Tsai .................... H01L 31/0203
                                                    438/65
(Continued)

FOREIGN PATENT DOCUMENTS

CN    104865002 A    8/2015
TW    200608499 A    3/2006
(Continued)

OTHER PUBLICATIONS

Le Goff et al., (2012). "Technological development of multispectral filter assemblies for micro bolometer," Proceedings Of SPIE, 10564, 5 pages.
(Continued)

*Primary Examiner* — Yasser A Abdelaziez
(74) *Attorney, Agent, or Firm* — Morrison & Foerster, LLP

(57) ABSTRACT

A method of manufacturing MEMS housings includes: providing glass spacers; providing a window plate; attaching the window plate to the glass spacers; aligning the glass spacers with a device glass plate having MEMS devices thereon; bonding the glass spacers to the device glass plate; and singulating the glass spacers, window plate, and device glass plate to produce the MEMS housings.

19 Claims, 13 Drawing Sheets

(52) U.S. Cl.
CPC . *B81C 2203/019* (2013.01); *B81C 2203/0118* (2013.01); *B81C 2203/035* (2013.01); *B81C 2203/05* (2013.01); *G01J 5/20* (2013.01)

(58) Field of Classification Search
CPC .......... B81C 2203/035; B81C 2203/05; B81C 1/00317; B81B 7/0038; B81B 2201/0207; G01J 5/20
See application file for complete search history.

(56) References Cited

U.S. PATENT DOCUMENTS

| | | | |
|---|---|---|---|
| 9,817,158 B2 * | 11/2017 | Kintz | ..................... G02B 13/18 |
| 2005/0101059 A1 * | 5/2005 | Yang | ................. H01L 27/14621 |
| | | | 257/E31.117 |
| 2009/0046183 A1 | 2/2009 | Nishida et al. | |
| 2013/0050227 A1 | 2/2013 | Petersen et al. | |
| 2015/0281601 A1 * | 10/2015 | Ganapathi | ......... H01L 27/14632 |
| | | | 438/66 |
| 2017/0285328 A1 | 10/2017 | Shinohara | |

FOREIGN PATENT DOCUMENTS

| | | |
|---|---|---|
| TW | 200642016 A | 12/2006 |
| WO | WO-2002042716 A2 | 5/2002 |

OTHER PUBLICATIONS

International Search Report and Written Opinion received for International Patent Application No. PCT/US2019/023227 dated Dec. 6, 2019, 12 pages.

* cited by examiner

CAPPING PLATE FOR PANEL SCALE PACKAGING OF MEMS PRODUCTS

CROSS REFERENCE TO RELATED APPLICATIONS

This application is a national stage application under 35 U.S.C. § 371 of International Application No. PCT/US2019/023227, filed internationally on Mar. 20, 2019, which claims the benefit of U.S. Provisional Application No. 62/645,687 filed Mar. 20, 2018, the entire contents of which are hereby incorporated herein by reference for all purposes.

FIELD OF THE INVENTION

This disclosure generally relates to microelectromechanical systems ("MEMS") and methods of manufacturing MEMS. More specifically, this disclosure relates to panel scale packaging of MEMS products.

BACKGROUND OF THE INVENTION

Traditional approaches to MEMS product manufacture include chip scale processes and wafer scale processes. On chip scale, a MEMS product manufacturing process dices a wafer into individual chips and then builds each individual MEMS device on each individual chip. Chip scale offers advantages over wafer scale manufacturing, including reduced footprints, straightforward assembly, and improvements in electrical performance. But building each MEMS product on the chip scale leads to redundancies in processing steps. These redundancies make chip scale manufacturing of MEMS products relatively costly and time-consuming.

Wafer scale manufacturing reduces cost and manufacturing time. On wafer scale, a MEMS product manufacturing process builds and packages multiple MEMS devices on the wafer. This approach allows the MEMS manufacturing process to simultaneously perform process steps for multiple MEMS devices. For example, a wafer scale manufacturing process can simultaneously package all the MEMS devices on a wafer. Once the manufacturing process has collectively packaged the MEMS devices, the wafer (with the packaged MEMS devices) is singulated (cut to yield the individual products).

Manufacturing scale sets product cost. Wafer scale manufacturing, for example, costs less per-product than chip scale manufacturing. If manufacturers could use larger wafers, then manufacturers could decrease the per-product costs. For example, MEMS products (such as thermal imagers) are traditionally built on silicon wafer substrates. Thus, wafer scale manufacturing of MEMS product is limited by silicon-wafer size; state-of-the art silicon wafer scale manufacturing uses 300 mm diameter wafers. Because of the advantages in increasing wafer size, many companies tried to increase wafer manufacturing to 450 mm diameter wafers. None were successful.

Panel scale manufacturing would allow for a reduction in MEMS product manufacturing costs. But no panel scale manufacturing process yet exists that can operate on full plate production. For example, a major cost of MEMS manufactured products can be the enclosure or packaging that provides protection from the environment; no packaging process yet exists that operates on the panel scale. This cost is especially important for MEMS devices that require protection from the environment (for example, some thermal imagers require a vacuum environment better than 10 mTorr for the life of the product). Thus, without a panel scale packaging process, panel scale manufacturing of MEMS products is limited.

SUMMARY OF THE INVENTION

Examples of the disclosure are directed toward MEMS products and panel scale packaging manufacturing processes for MEMS products that overcome the above-identified drawbacks. The described manufacturing processes include production of a suitable capping plate(s) that can be aligned with and bonded onto a device substrate prior to singulation. As an exemplary advantage, the disclosed manufacturing processes may include plate capping procedures that enable full panel scale production. As another exemplary advantage, the disclosed manufacturing processes may reduce production costs.

In one embodiment, a method of manufacturing MEMS products includes: providing glass spacers; providing a window plate; attaching the window plate to the glass spacers; aligning the glass spacers with a MEMS device glass plate; bonding the glass spacers to the MEMS device glass plate; and singulating the glass spacers, window plate, and MEMS device glass plate to produce the MEMS products. Example MEMS products include thermal imagers such as uncooled microbolometers.

In some embodiments, the MEMS device glass plate and the window plate each measure at least 750 mm by 620 mm.

In some embodiments, the window plate is sufficiently thick and stiff to provide structural support.

In some embodiments, providing a window plate includes depositing an anti-reflective coating on the glass spacers and coupling a wavelength-specific transmissive window to the anti-reflective coating.

In some embodiments, depositing the anti-reflective coating includes thin-film depositing at least two layers with different refractive indexes. In some embodiments, providing glass spacers includes: providing a glass substrate and forming the glass spacers from the glass substrate; and depositing the anti-reflective coating can include depositing the anti-reflective coating on the glass substrate. In some embodiments, coupling a wavelength-specific transmissive window to the anti-reflective coating comprises thin-film depositing the window on the anti-reflective coating.

In some embodiments, providing glass spacers includes: providing a glass substrate and forming the glass spacers from the glass substrate. In some embodiments, attaching a window plate to the glass spacers includes attaching the window plate to the glass substrate before forming the glass spacers from the glass substrate. In some embodiments, the glass substrate includes a photo sensitive glass substrate and forming the glass spacers includes structurally modifying sections of the glass substrate and then removing the structurally modified sections. In some embodiments, providing glass spacers includes placing a mask on the glass substrate and removing non-masked sections.

In some embodiments, providing the window plate includes attaching silicon wafers to the glass spacers. In some embodiments, the silicon wafers include single crystal silicon. In some embodiments, attaching silicon wafers to the glass spacers includes distributing the silicon wafers on the glass spacers and bonding the silicon wafers to the glass spacers. In some embodiments, the silicon wafers include an antireflective coating.

In some embodiments, providing the glass spacers and providing the window plate includes etching an array of wells in a plurality of silicon wafers. In some embodiments, attaching the window plate to the glass spacers and aligning the glass spacers with a MEMS device glass plate includes: coupling a release layer to a handling plate; coupling, to the release layer, the plurality of silicon wafers so that the array of wells is distal to the release layer; and coupling, to the MEMS device glass plate, the plurality of silicon wafers so that the array of wells is proximal to the MEMS device glass plate. In some embodiments, bonding the glass spacers to the MEMS device glass plate includes bonding the plurality of silicon wafers to the MEMS device glass plate. In some embodiments, singulating the glass spacers, window plate, and MEMS device glass plate to produce the MEMS products includes decoupling the release layer from the plurality of silicon wafers and singulating the MEMS products from the bonded MEMS device and plurality of silicon wafers. In some embodiments, the silicon wafer is single crystal silicon.

In some embodiments, bonding the glass spacers to the MEMS device glass plate includes adding solder to the glass spacers on a surface distal to the window plate.

In some embodiments, the method further includes depositing a getter material on the glass spacers and window plate and dry-etching the getter material from the window plate.

In some embodiments, bonding the glass spacers to the MEMS device glass plate includes: placing the window plate and MEMS device glass plate in a vacuum environment and increasing temperature in the vacuum environment.

BRIEF DESCRIPTION OF THE DRAWINGS

FIG. 8B illustrates free carrier absorption coefficient vs dopant concentration for n-type Si, in accordance with an embodiment.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Examples of the disclosure are directed toward MEMS products and panel scale packaging manufacturing processes for MEMS products that overcome the above-identified drawbacks. The described manufacturing processes include production of a suitable capping plate(s) that can be aligned with and bonded onto a device substrate prior to singulation. As an exemplary advantage, the disclosed manufacturing processes may include plate capping procedures that enable full panel scale production. As another exemplary advantage, the disclosed manufacturing processes may reduce production costs. As yet another exemplary embodiment, the disclosed manufacturing process may reduce the need to handle delicate parts individually.

Figure 1:
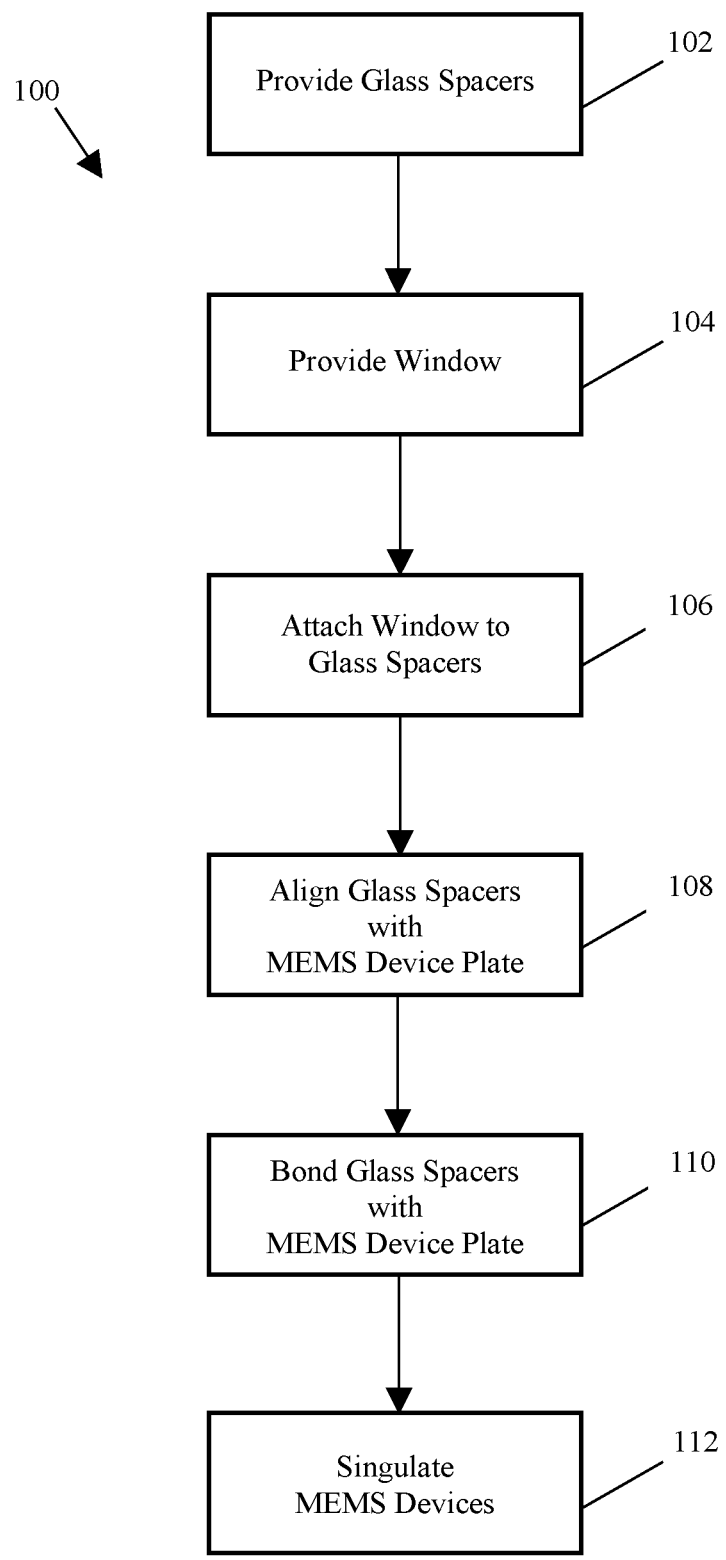
FIG. 1 illustrates a method of manufacturing MEMS products, in accordance with an embodiment.

FIG. 1 illustrates a method 100 of manufacturing MEMS products, in accordance with an embodiment. Method 100 includes providing glass spacers (step 102), providing a window plate (step 104), attaching the window plate to the glass spacers (step 106), aligning the glass spacers with a MEMS device glass plate (step 108), bonding the glass spacers to the MEMS device glass plate (step 110), and singulating the glass spacers, window plate, and MEMS device glass plate to produce the MEMS products (step 112). In some embodiments, spacers are walls or interposers between the MEMS device glass plate and the window plate. In some embodiments, spacers are between 10 μm to 1000 μm high (as measured from the window plate). In some embodiments, the spacers are 50 μm to 200 μm high. In some embodiments, the width of the spacers provide sufficient strength and adequate bonding area. In some embodiments, the width of the spacers is between 50 μm and 3 mm.

In some embodiments, the MEMS device glass plate and the window plate each measure at least 620 mm by 750 mm. Such device plate and window plate sizing can reduce manufacturing costs compared to traditional manufacturing processes. In some embodiments, the MEMS device glass plate and the window plate each measure at least 680 mm by 880 mm, at least 730 mm by 920 mm, at least 730 mm by 920 mm, at least 1100 mm by 1300 mm, at least 1300 mm by 1500 mm, at least 1500 mm by 1850 mm, at least 1870 mm by 2200 mm, at least 1950 mm by 2250 mm, at least 2160 mm by 2450 mm, at least 2200 mm by 2500 mm, at least 2400 mm by 2800 mm, and at least 2580 mm by 3050 mm.

In some embodiments, the window plate is sufficiently thick and stiff to provide structural support to the MEMS product. One of skill in the art will appreciate that the degree of thickness and stiffness will depend on the application of the singulated device. Stiffness may be a function of the device's environment, for example the pressure applied to the device. Some applications that can affect stiffness include handling during parts assembly, human touch, atmospheric pressure when vacuum sealed, and liquid pressure if immersed. The stiffness requirement may also depend on the unsupported span of the window; the larger the span, the stiffer the material may need to be. Stiffness may also be affected by tensile stress in the window (e.g., a drumhead). In some embodiments, the window plate is 0.5 mm thick.

In some embodiments, bonding the glass spacers to the MEMS device glass plate (step 110) includes adding solder to the glass spacers on a surface distal to the window plate, aligning the solder with complimentary solder on the MEMS device glass plate, heating the solder, and allowing the solder to cool and harden.

In some embodiments, method 100 further includes depositing a getter material on the glass spacers and window plate and dry-etching the getter material from the window area. In some embodiments, method 100 further includes using a shadow mask or liftoff process to pattern the getter material.

In some embodiments, bonding the glass spacers to the MEMS device glass plate (step 110) includes placing the window plate and MEMS device glass plate in a vacuum environment and increasing temperature in the vacuum environment. The temperature may be increased such that the getter material (if applicable) is activated and the solder (if applicable) flows. In some embodiments, the temperature is not increased to the degradation temperature of the device structures. In some embodiments, the process produces a hermetic seal. In some embodiments, the vacuum environment is 10 mTorr.

Figure 2A:
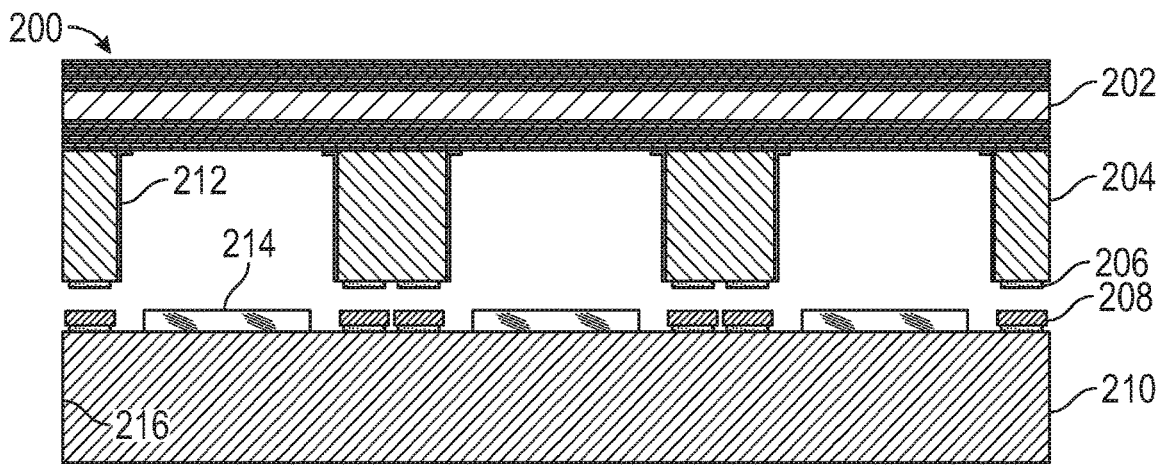
FIGS. 2A-C illustrate a method of manufacturing MEMS products, in accordance with an embodiment.
Figure 2B:
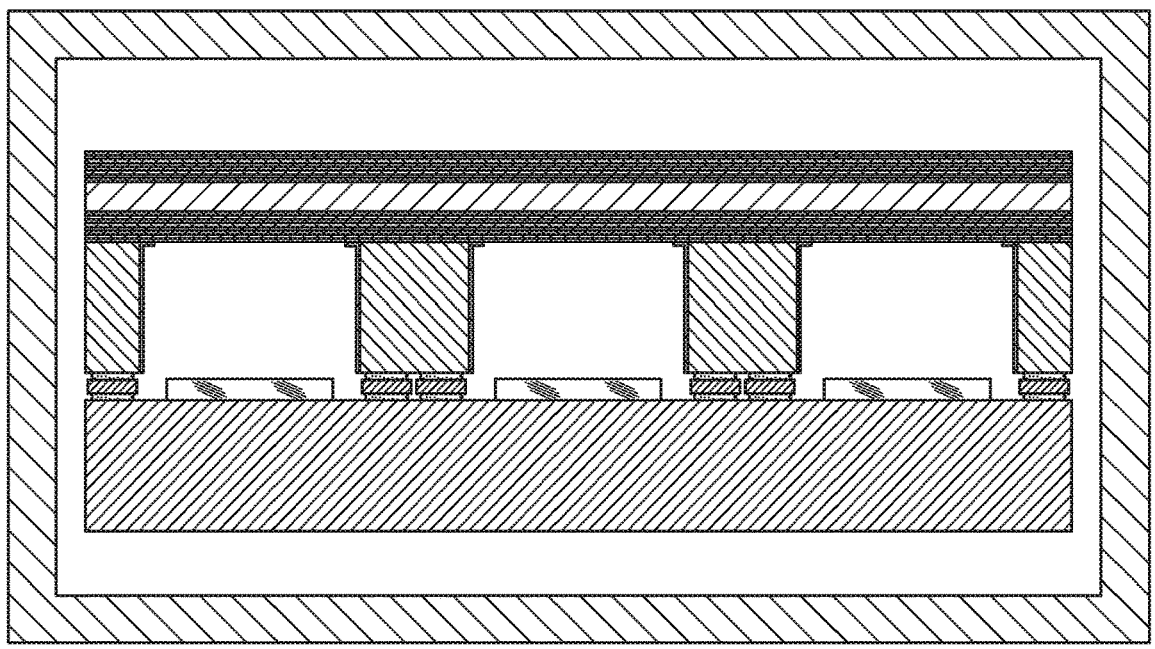
Figure 2C:
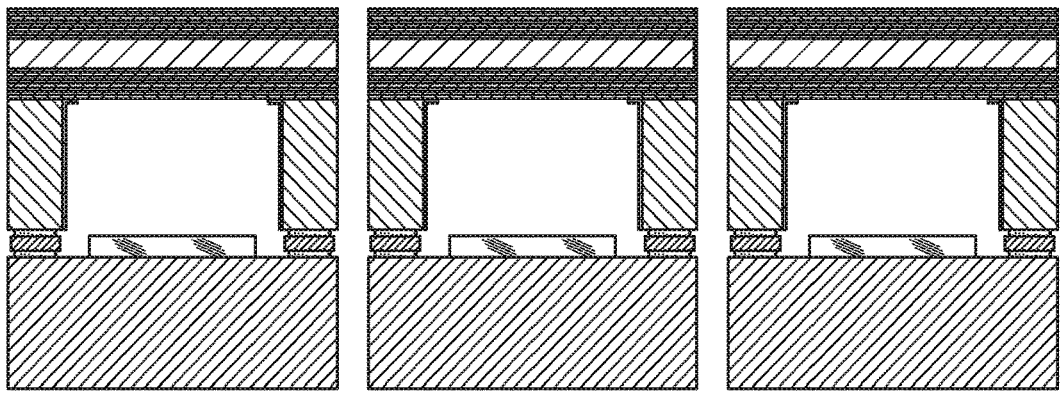

FIG. 2 illustrates a method 200 of manufacturing MEMS products, in accordance with an embodiment. In method 200, window plate 202 is first aligned (FIG. 2A) with device plate 210. Device plate 210 includes MEMS Devices 214. Window plate 202 and device plate 210 host solder pads 206 and 208, respectively. In some embodiments, the solder pads are added using suitably chosen solder materials patterned (e.g., via screen printing).

The aligned, but not yet bonded, pair of plates is then placed (FIG. 2B) in a vacuum environment and the temperature is raised 1) to activate the getter material 212, 2) to flow the solder 206 and 208, 3) but without damaging devices structures (i.e., the temperature is not raised to or beyond the degradation temperature for the device structures). Pressure is applied for a suitable period of time to conclude the plate packaging process.

This is followed by singulation (FIG. 2C) to produce the individual MEMS products. In some embodiments, singulation is performed by scribe and break methods, sawing, or cutting by hot wire.

Figure 3:
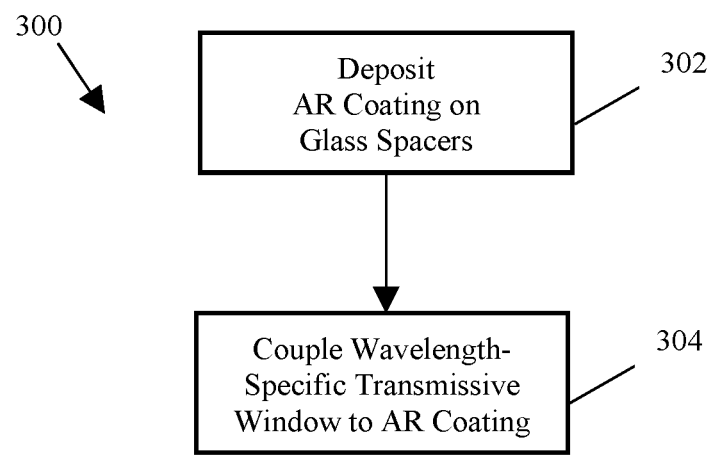
FIG. 3 illustrates a method of manufacturing MEMS products, in accordance with an embodiment.

FIG. 3 illustrates a method 300 of manufacturing MEMS products, in accordance with an embodiment. Method 300 includes depositing an anti-reflective ("AR") coating on the glass spacers (step 302) and coupling a wavelength-specific transmissive window (step 304). In some embodiments, coupling a wavelength-specific transmissive window includes thin-film depositing the window on the AR coating. In some embodiments, the wavelength-specific transmissive window is a long wave infrared transmissive window (8 μm to 14 μm). In some embodiments, the wavelength-specific transmissive window passes multiple wavelengths over a range. In some embodiments, the wavelength-specific transmissive window passes radiation of the wavelength(s) with minimal absorption and reflection. In some embodiments, step 104 (providing a window plate) in method 100 includes steps 302 and 304 in method 300.

Some embodiments include coupling a wavelength-specific transmissive window to an AR coating before coupling the combination to a substrate. In such embodiments, glass spacers may be formed from the substrate before or after the substrate is coupled to the combination of wavelength-specific transmissive window and AR coating.

In some embodiments, depositing the anti-reflective coating (step 302) includes thin-film depositing at least two layers with different refractive indexes. In some embodiments, providing glass spacers, step 102 in method 100, includes providing a glass substrate, depositing the anti-reflective coating (step 302) and later forming the glass spacers from the glass substrate (exemplary methods of forming glass spacers from a glass substrate are described below). Depositing the anti-reflective coating before forming the glass spacers from the glass substrate may advantageously allow the differences between the AR coating to provide an etch stop when etching the glass spacers from the glass substrate. In some embodiments, the glass spacers are formed before attaching the window plate to the glass spacers. In such embodiments, etching of the glass substrate may not continue through the entire substrate to leave a thin window layer on which to deposit the AR coating.

In some embodiments, providing glass spacers, step 102 in method 100, includes providing a glass substrate and forming the glass spacers from the glass substrate. In some embodiments, attaching a window plate to the glass spacers includes attaching the window plate to the glass substrate before forming the glass spacers from the glass substrate. In some embodiments, the glass substrate includes a photo sensitive glass substrate (for example, Schott Foturan) and forming the glass spacers (step 102) includes structurally modifying sections of the glass substrate and then removing the structurally modified sections. For example, a photoresist mask can be placed on the glass substrate, the glass substrate can be exposed to UV radiation to ceramicize sections of the glass substrate, and then the ceramicized portions can be removed by a HF etch (as described more below with respect to FIG. 4). In some embodiments, providing glass spacers includes placing a mask on a non-photosensitive glass substrate and removing non-masked sections of the glass substrate.

FIG. 4 illustrates a method 400 of manufacturing MEMS products, in accordance with an embodiment. The starting substrate 402 is a photosensitive glass such as Schott's Foturan material (see FIG. 4A). The material composition is such that upon exposure (see FIG. 4B) to suitable UV radiation 404, the exposed glass material 406 transforms into a ceramic form which etches faster in a HF solution 414 than the unexposed glass 408.

Figure 4A:
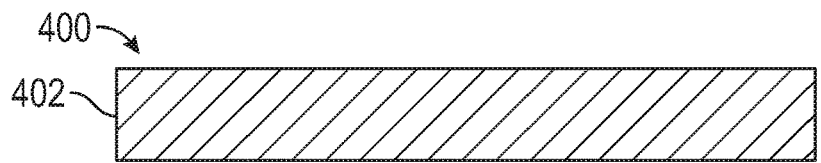
FIGS. 4A-F illustrate a method of manufacturing MEMS products, in accordance with an embodiment.
Figure 4B:
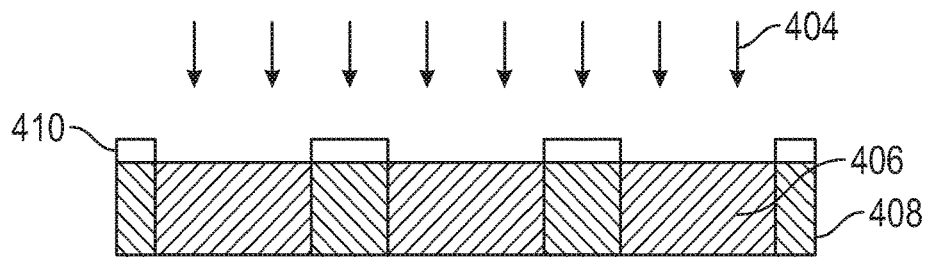
Figure 4C:
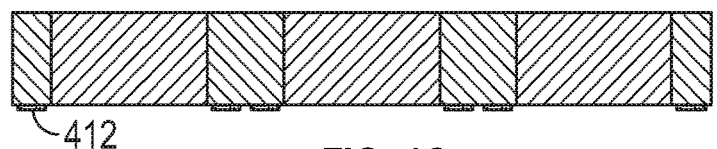
Figure 4D:
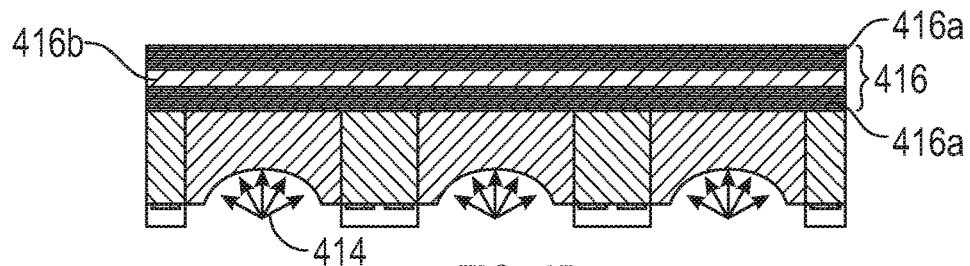
Figure 4E:
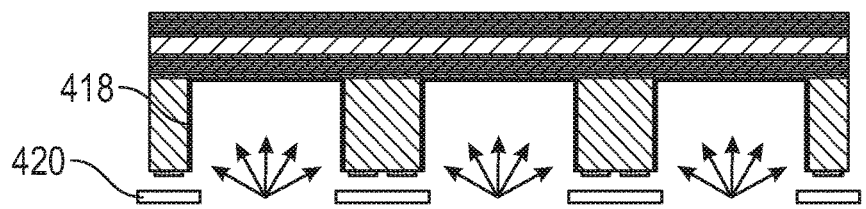
Figure 4F:
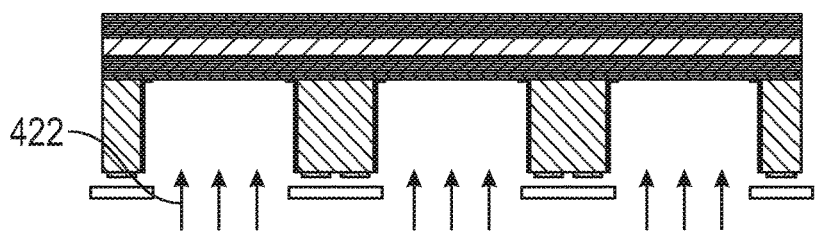

After the etch, further metamorphosis is prevented by bulk exposure (see FIG. 4C) to the same UV radiation, into ceramic form. As shown in the sequence, the glass is exposed with a suitably patterned photoresist mask 410, with the overall pattern defining the transparent window regions of the package. As shown in FIG. 4C, a set of solder pads 412 are then patterned (typical deposition followed by patterned etch) on the bottom side with the pitch and position corresponding to the device plate.

In the next step, the LWIR (long wave IR) window stack 416 is deposited (see FIG. 4D) on the top side of the glass window plate. To minimize reflection across the entire 8-14 μm LWIR band, multiple high/low index layers (416a) can be placed on both sides of the window which is defined by a central layer (416b) that is sufficiently thick and stiff so as to provide adequate mechanical integrity. In some embodiments, evaporated silicon is deposited to form the transmissive window. This technique may advantageously allow for deposition rates up to 1 μm/sec and deposit high quality films with low contamination. In some embodiments, the surface is textured with small grooves or notches to form a graded index layer to reduce reflections. The depth and size of the notches may be similar to the desired transmission wavelength.

Because of the photodefined glass, the etch (see FIG. 4D) may advantageously be directional. Non-photosensitive substrate can also be used with proper photomasking, to define the window regions. Advantageously, the etch selectivity between SiO2 and the AR stack of the window layers may be sufficient for process control of the window etch. The resulting structure preserves the glass as the mechanical frame of the window while opening up the active window area to the LWIR window stack.

A thin film getter material 418 can be deposited (see FIG. 4E) onto the bottom side of the structure as illustrated. This can be done with a shadow mask 420 or the masking can be done with typical photoresist patterning. A patterned direction etch 422 is then performed (see FIG. 4F) to remove the getter material from the active window areas. This concludes the preparation of the window structure, prior to the attachment to the device substrate.

Figure 5:
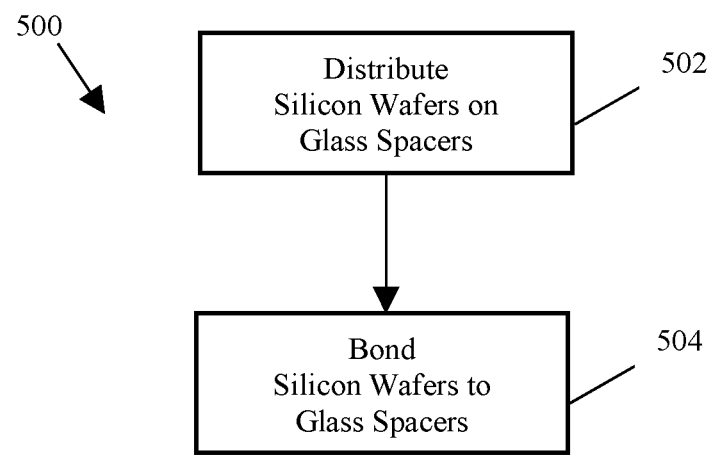
FIG. 5 illustrates a method of manufacturing MEMS products, in accordance with an embodiment.
Figure 6A:
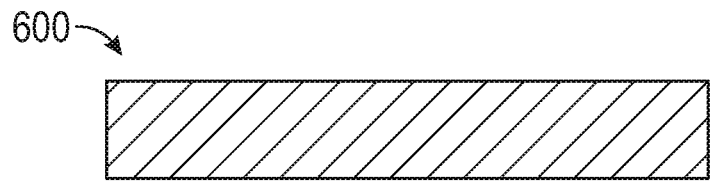
FIGS. 6A-E illustrate a method of manufacturing MEMS products, in accordance with an embodiment.
Figure 6B:
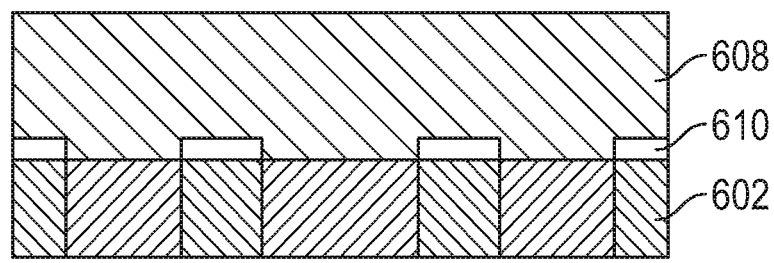
Figure 6C:
Figure 6D:
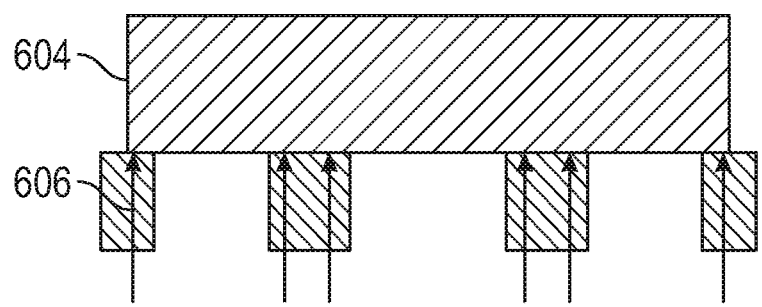
Figure 6E:
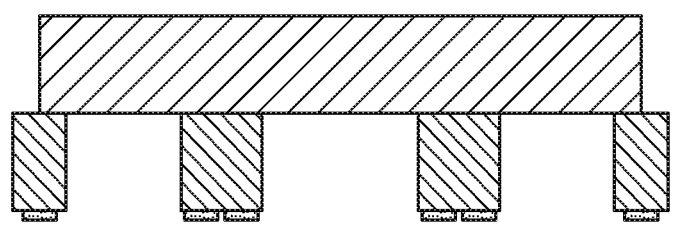

FIG. 5 illustrates a method 500 of manufacturing MEMS products, in accordance with an embodiment. Method 500 includes distributing silicon wafers on glass spacers (step 502) and bonding the silicon wafers to the glass spacers (step 504). In some embodiments, providing the window plate, step 104 in method 100, includes attaching silicon wafers to the glass spacers, step 502 in method 500. In some embodiments, the silicon wafers are squares of size 150 mm cut from 8" silicon wafers. In some embodiments, the silicon wafers are 12" circular wafers. In some embodiments, the silicon wafers are constructed of single crystal silicon. In some embodiments, single crystal silicon is 100% crystal. In some embodiments, the silicon wafer is solar grade silicon. In some embodiments, the solar grade silicon is provided in square wafers with chamfered corners. In some embodiments, solar grade silicon has impurity levels higher than electronic grade silicon. Solar grade silicon may include higher impurity content that reduces transmission at LWIR and, further, multicrystalline silicon may include grain boundaries that reduces barrier properties. In some embodiments, the deposition of the AR layers may advantageously reduce such issues. In some embodiments, bonding the silicon wafers to the glass spacers (step 504) includes at least one of anodic bonding, solder bonding, and laser bonding. In some embodiments, the silicon wafers include an antireflective coating.

FIG. 6 illustrates a method 600 of manufacturing MEMS products, in accordance with an embodiment. Method 600 may provide an alternative process to reduce process time and/or cost. Method 600 includes distributing discrete silicon wafers to a glass frame via silicon to glass laser bonding techniques.

Method 600 may use single crystal silicon in lieu of amorphous materials deposited using thin film techniques. Method 600 may use solar grade silicon, which offers a significant cost reduction when compared to the industry standard Float Zone silicon.

Method 600 begins (see FIG. 6A) with 8" silicon wafers 604 (in some embodiments wafer 604 is solar grade silicon cut into 150 mm square format). The wafers 604 are then batch polished on both sides to sufficient quality for the given application to allow for minimal scattering at the 10 μm wavelength. In some embodiments, a 50 angstrom RMS surface finish is used for optical (visible wavelength) applications. For a LWIR application where the center wavelength is 20× longer than the visible range, the surface finish requirement can be relaxed to 1000 angstroms RMS, so the polishing cost likewise decreases. After polishing both sides, the wafers can then be AR coated on both sides following standard recipes.

A plate glass of the same size as the device plate (or cut to a subplate thereof), nominally of the same thickness as the device plate, 0.5 mm is first patterned (see FIG. 6B) via photolithography followed by HF etch 608 using photoresist mask 610 (as explained above) to produce a glass frame 602 (see FIG. 6C). The Si wafers 604 are then distributed (see FIG. 6D) on top of the glass frame 602. In some embodiments, a device plate is laid out so as to anticipate the wafer to wafer gaps, on the distribution of wafers on the frame.

The silicon wafers 604 and the glass frame 602 can then be bonded (see FIG. 6D) using one of several techniques available. Anodic bonding can be used and even a solder bond can be used as long as the resultant metal can withstand the later frame glass to device glass solder bond process. Method 600 shows a laser bonding technique where localized bonding is achieved by a laser beam 606 focused through the transparent glass frame 602. After the bonding is done, the packaging process can proceed as described before (see, e.g., FIG. 6E with solder pads added to the glass frame).

Figure 7:
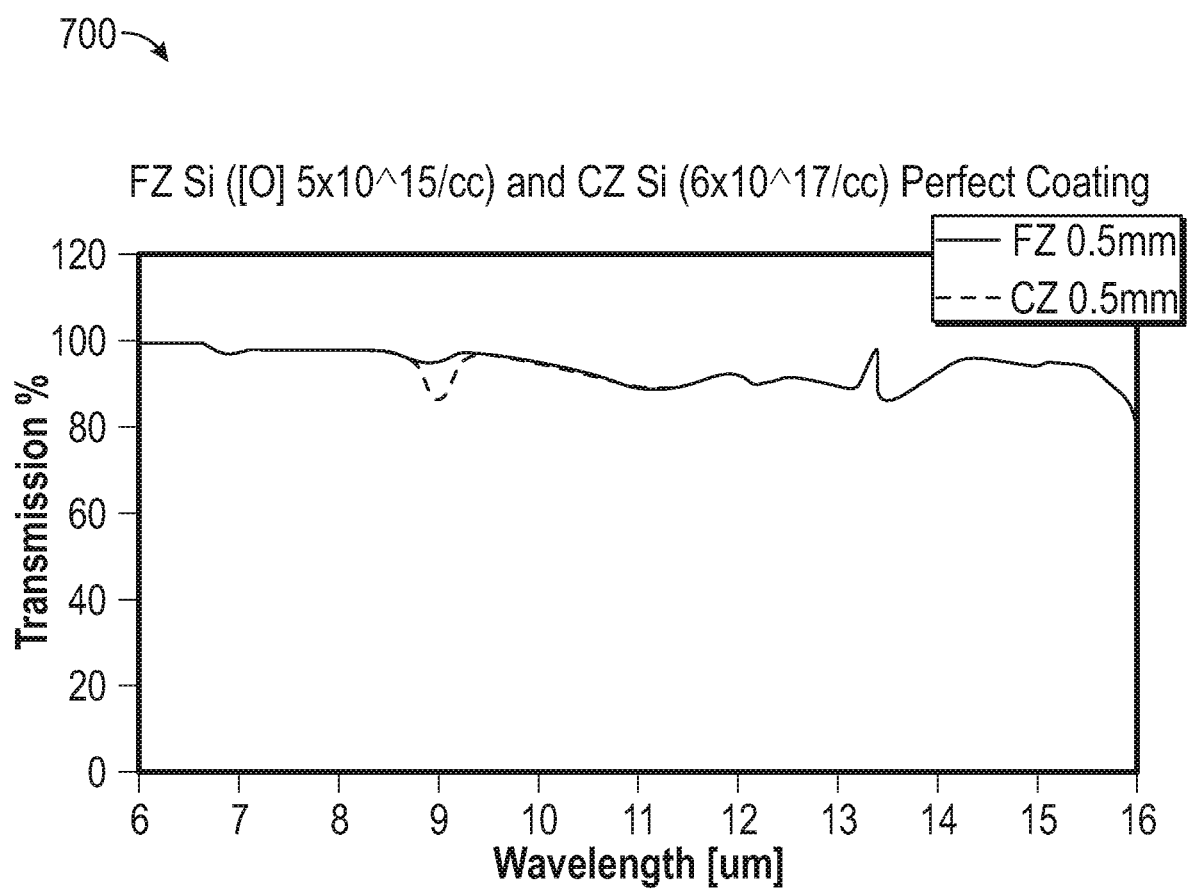
FIG. 7 graphs transmission through an AR-coated Si window with 0.5 mm thickness, in accordance with an embodiment.

As referenced above, single crystal silicon wafers may be used to produce the window plate. The window should be adequately thick to provide mechanical robustness as well as provide the barrier function. In some embodiments, thickness on the order of 0.5 mm is sufficient to hold the packaging vacuum needed. The window should allow transmission of long wave infrared light with minimal absorption, which primarily occur via two distinct mechanisms. Oxygen impurities that are incorporated in typical single crystal silicon boules whether grown by Czochralski or Float Zone methods lead to a strong absorption band centered near 9 μm, due to multiphonon processes. The Float Zone method yields a lower oxygen concentration than Czochralski but for the purpose of an LWIR window, the difference may not be sufficiently significant to warrant the cost difference. As shown in FIG. 7, the actual absorption difference between a typical Czochralski process (Cz) grown silicon wafer of 0.5 mm thickness versus another grown by Float Zone of the same thickness is not large. Unexpectedly, much-cheaper Cz-type of material can be used as a wavelength-trasnmissive window in an LWIR application.

FIG. 7 illustrates transmission through a perfectly AR (anti-reflection) coated Si window with 0.5 mm thickness. The FZ has lower Oxygen concentration which is marked by the lower absorption at 9 μm when compared with a comparable Cz material. Both are high resistivity (>100 ohm-cm).

Another relevant parameter can be free carrier absorption, which increases with the wavelength squared. This is typically controlled by the type of dopant and the dopant concentration, which correlates with the resistivity of the material. The absorption coefficient is proportional to the wavelength squared and inversely proportional to the product of the mobility and the square of the effective mass. This, as shown in FIG. 8B, favors n-type in silicon, as far as lower absorption is concerned.

Figure 8A:
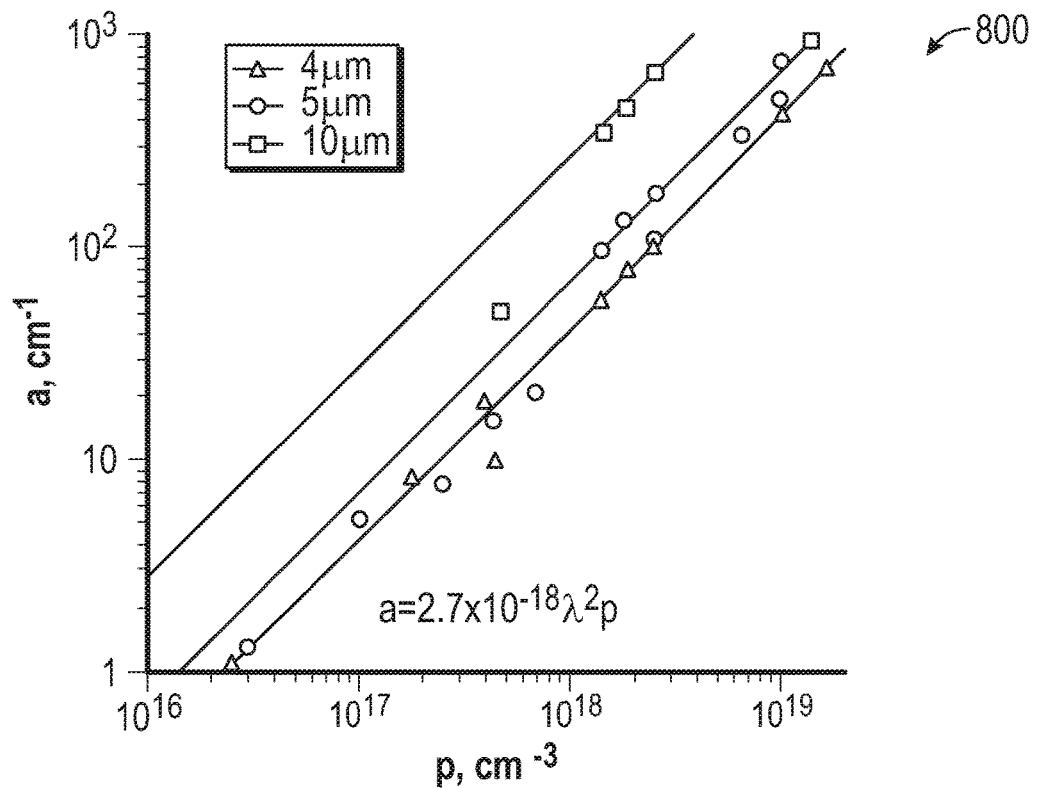
FIGS. 8A-B graph free carrier absorption coefficient vs dopant concentration for p-type Si, in accordance with an embodiment.
Figure 8B:
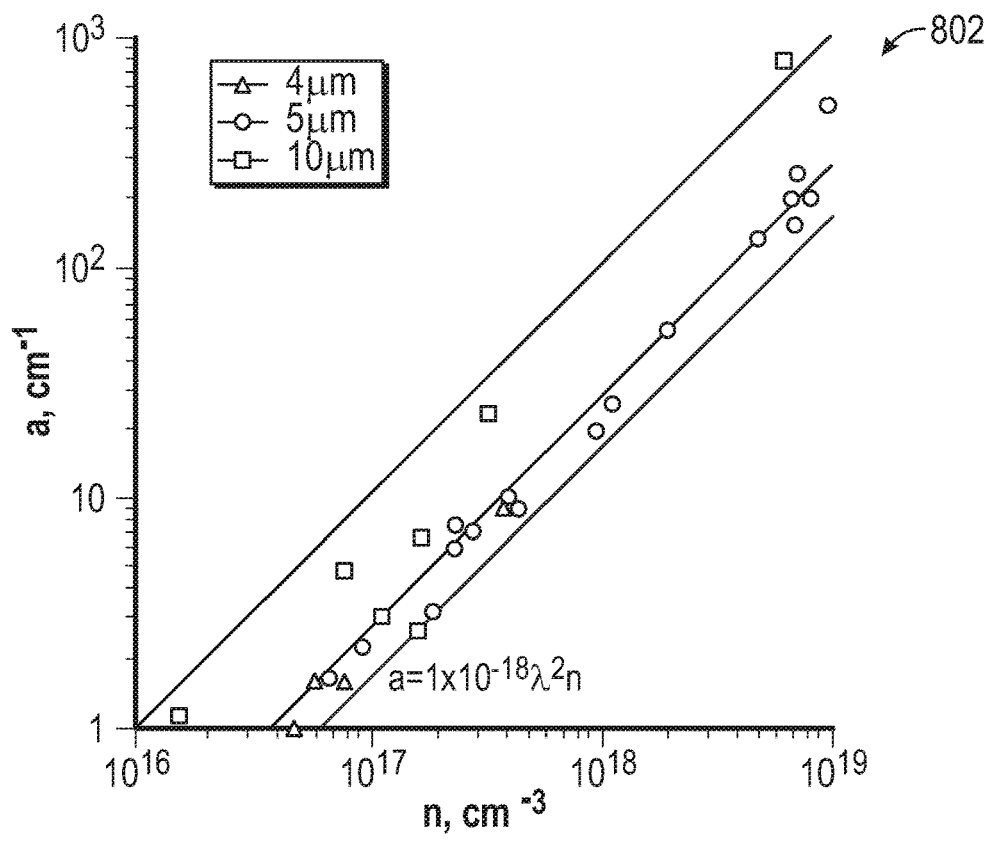

FIG. 8A shows free carrier absorption coefficient vs dopant concentration for p-type Si (left) and FIG. 8B shows free carrier absorption coefficient vs dopant concentration for n-type Si (right). N-type has lower absorption for a given concentration due to its higher mobility. The top line (with open square data points) corresponds to absorption at 10 μm wavelength. All data is taken at 300K.

Figure 9:
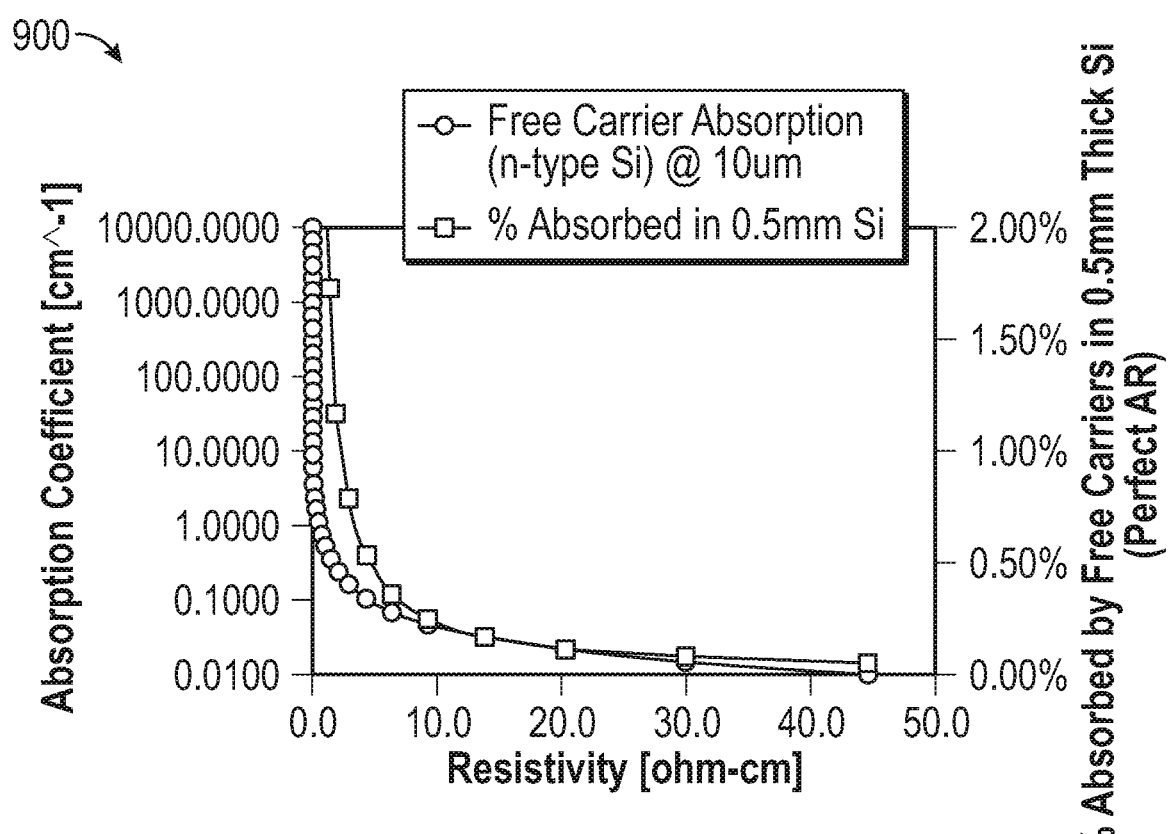
FIG. 9 graphs free carrier absorption in n-type Si at 10 μm wavelength versus resistivity, in accordance with an embodiment.

For the n-type selection, the inventors calculated the absorption coefficient at 10 μm wavelength versus the resistivity of the material. The results are shown in FIG. 9 (free carrier absorption in n-type Si at 10 μm wavelength versus resistivity), which indicates that a resistivity of 10 ohm-cm is sufficient to ensure less than 0.24% free carrier absorption at 10 μm. The empirical dependence of the n-type absorption coefficient on the dopant concentration and wavelength was determined by $$\alpha_n = 10^{-18} \lambda^2 N [\text{cm}^{-1}]$$

where the wavelength is in micrometer units and the dopant density N is given in $\text{cm}^{-3}$.

Figure 10:
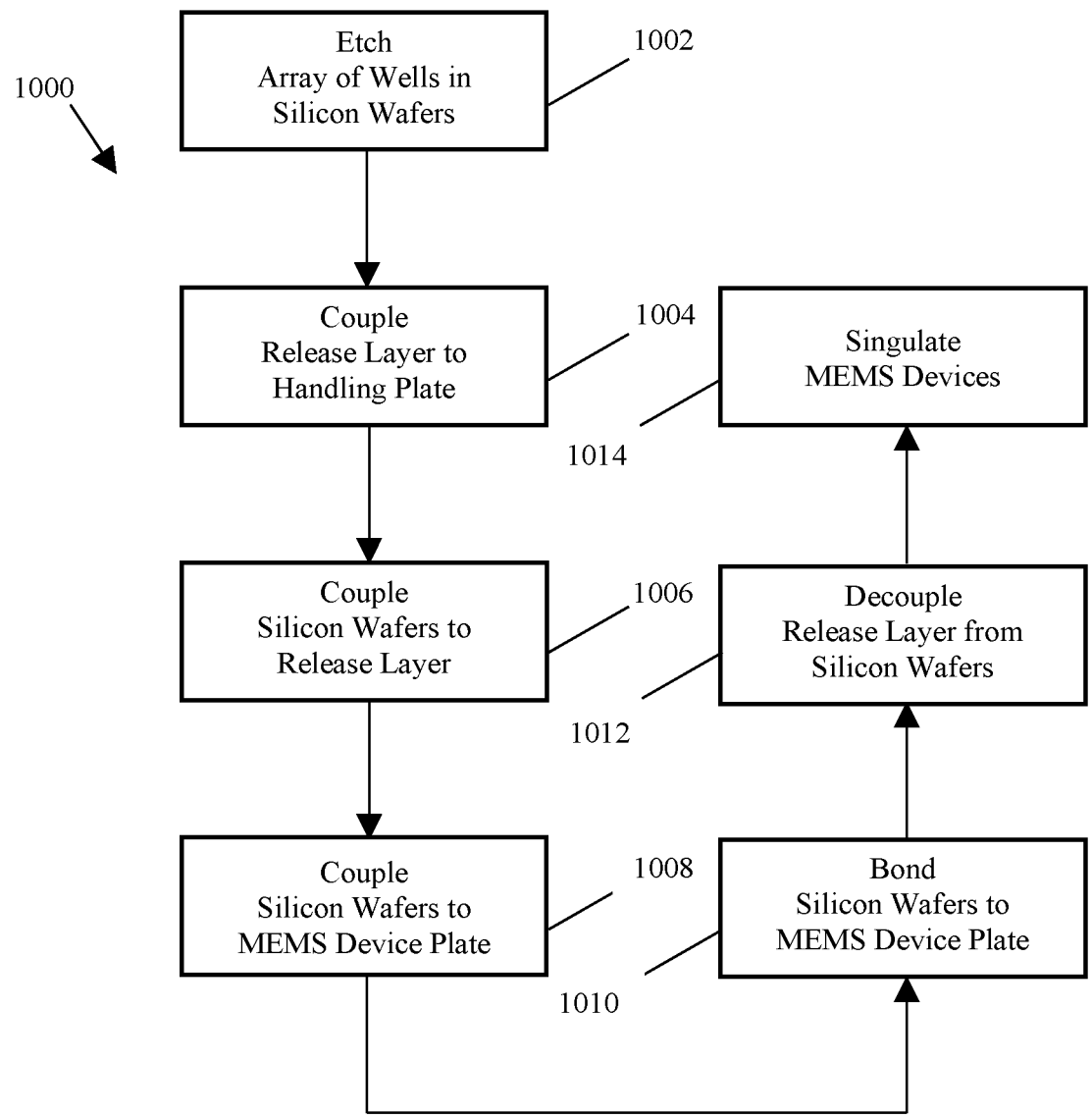
FIG. 10 illustrates a method of manufacturing MEMS products, in accordance with an embodiment.

FIG. 10 illustrates a method 1000 of manufacturing MEMS products, in accordance with an embodiment. Method 1000 includes etching an array of wells in a plurality of silicon wafers (step 1002), coupling a release layer to a handling plate (step 1004), coupling, to the release layer, the plurality of silicon wafers so that the array of wells is distal to the release layer (step 1006), coupling, to the MEMS device glass plate, the plurality of silicon wafers so that the array of wells is proximal to the MEMS device glass plate (step 1008), bonding the plurality of silicon wafers to the MEMS device glass plate (step 1010), decoupling the release layer from the plurality of silicon wafers (step 1012), and singulating the MEMS products from the bonded MEMS device and plurality of silicon wafers (step 1014).

In some embodiments, providing the glass spacers and providing the window plate, steps 102 and 104 of method 100, may include step 1002 of method 1000. In some embodiments, attaching the window plate to the glass spacers and aligning the glass spacers with a MEMS device glass plate, steps 106 and 108 of method 100, includes steps 1004, 1006, and 1008 of method 1000. In some embodiments, bonding the glass spacers to the MEMS device glass plate, step 110 of method 100, includes bonding the plurality of silicon wafers to the MEMS device glass plate (step 1010). In some embodiments, singulating the glass spacers, window plate, and MEMS device glass plate to produce the MEMS products, step 112 of method 100, include steps 1012 and 1014 of method 1000. In some embodiments, the silicon wafer is single crystal silicon as described above.

Figure 11:
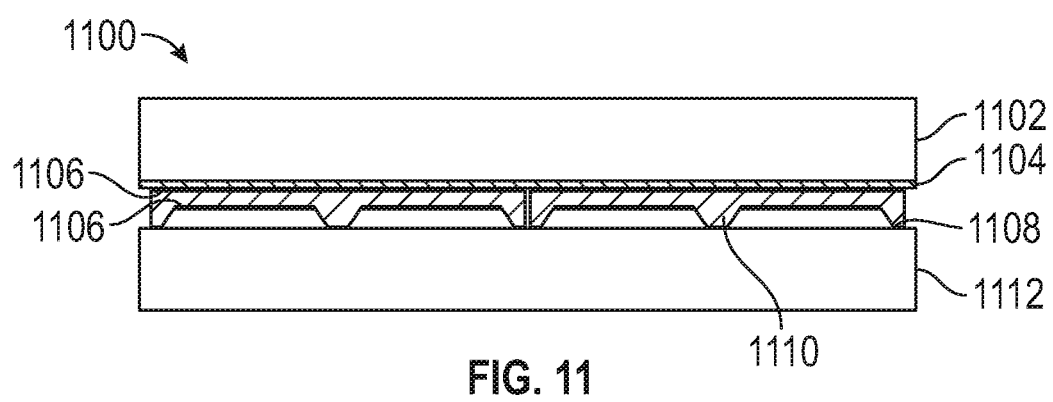
FIG. 11 illustrates a method of manufacturing MEMS products, in accordance with an embodiment.

FIG. 11 illustrates a method 1100 of manufacturing MEMS products, in accordance with an embodiment. Method 1100 forgoes the glass interposer described in, for example, method 400 above and instead etches the necessary gap between the silicon window inner surface and the device by etching an array of wells in the silicon prior to bonding to the device glass. This is illustrated in FIG. 11 where the silicon window wafers 1108 shown with the wells already etched and subsequently AR coated (1106) on both sides are held in array form by a mechanical superstrate 1102, temporarily bonded (via a release layer 1104, e.g.) to the outer surfaces of the window wafers. Such a superstrate layer can be made of a polymeric material or can also be glass, both readily available in sizes to match the device plate glass size. With the array of silicon wafers held in the appropriate positions, the metal pads (1110) needed for solder bonding can be applied onto the silicon wafers (screen printing, inkjet or other low cost methods), prior to solder bonding onto the device glass (1112).

Figure 12:
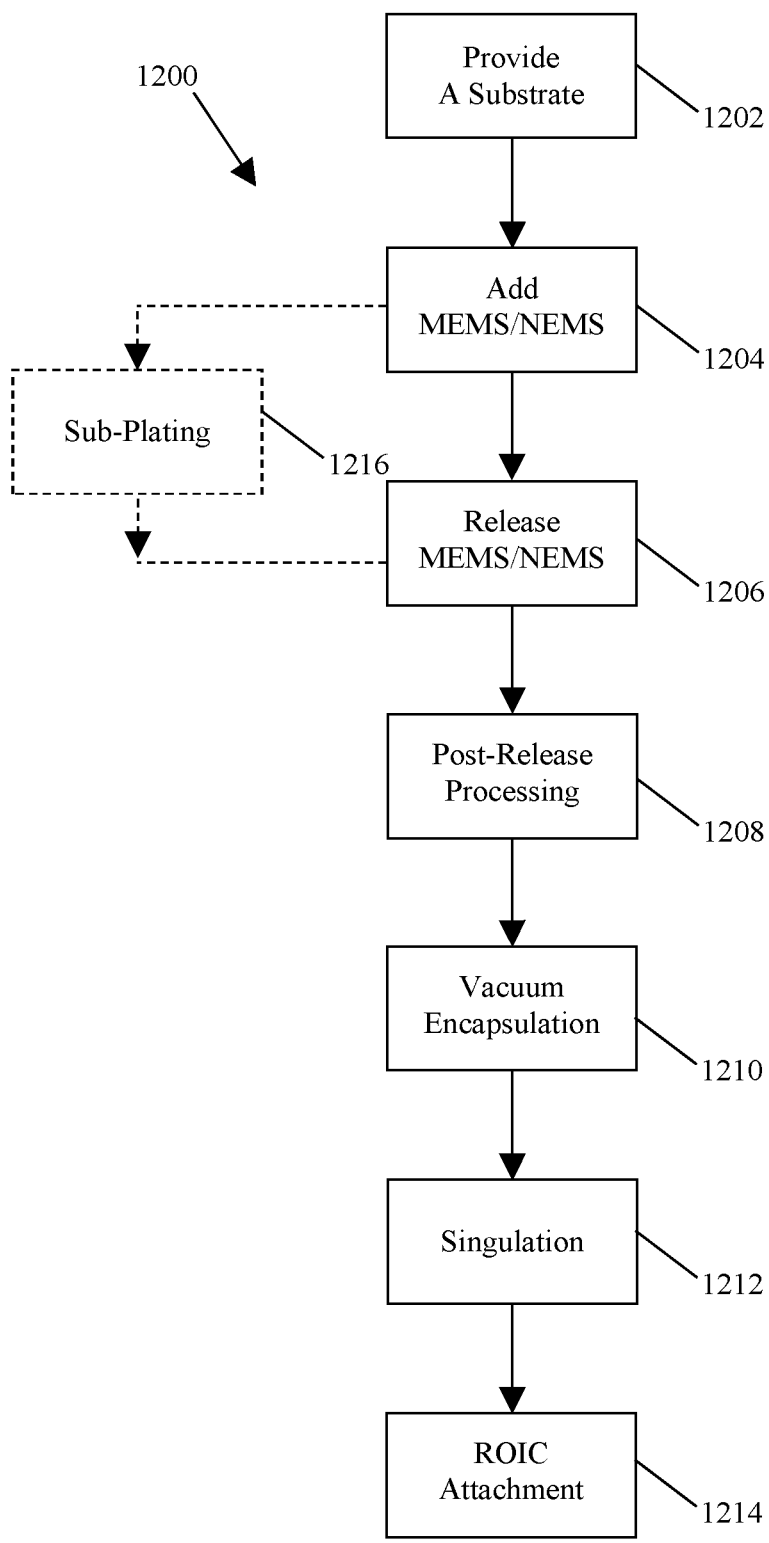
FIG. 12 illustrates a method of manufacturing MEMS products, in accordance with an embodiment.

FIG. 12 illustrates a method 1200 of manufacturing an electromechanical system, in accordance with an embodiment. To manufacture an electromechanical system, all or some of the process steps in method 1200 could be used and used in a different order. A non-limiting example, Step 1214 could be performed before Step 1212.

Method 1200 includes Step 1202, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle™, which produces an alkaline earth boro alumino-silicate (a silicate loaded with boron, aluminum, and various alkaline earth elements). Other variations are available from Asahi Glass™ or Schott™.

In some embodiments, a flat panel glass process is used to manufacture the electromechanical system. In some embodiments, a liquid crystal display (LCD) process is used to manufacture the electromechanical system. In some embodiments, an OLED display process or an x-ray panel process is used. Employing a flat panel glass process may allow for increased substrate sizes, thereby allowing for a higher number of electrochemical systems per substrate, which reduces processing costs. "Panel level" sizes can include 620 mm×750 mm, 680 mm×880 mm, 1100 mm×1300 mm, 1300 mm×1500 mm, 1500 mm×1850 mm, 1950 mm×2250 mm, and 2200 mm×2500 mm. Further, thin film transistors (TFTs) in panel level manufacturing can also reduce cost and so, for example, LCD-TFT processes can be beneficial.

Method 1200 includes Step 1204, adding MEMS to the substrate. Although MEMS is used to describe the addition of structures, it should be appreciated that other structures could be added without deviating from the scope of this disclosure. In embodiments using panel level processing, the MEMS structures may be added using an LCD-TFT process.

Step 1204 may be followed by optional Step 1216, sub-plating. Step 1216 may be used when the substrate is larger than the processing equipment used in subsequent steps. For example, if using a panel level process (such as LCD), some embodiments will include (at Step 1204) cutting the panel into to wafer sizes to perform further processing (using, for example, CMOS manufacturing equipment). In other embodiments, the same size substrate is used throughout method 1200 (i.e., Step 1216 is not used).

Method 1200 includes Step 1206, releasing the MEMS from the substrate.

Method 1200 includes Step 1208, post-release processing. Such post-release processing may prepare the MEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 1200 includes Step 1210, vacuum encapsulation of the MEMS structure, where necessary. Vacuum encapsulation may be beneficial to prolong device life.

Method 1200 includes Step 1212, singulation. Some embodiments may include calibration and chip programming, which may take into account the properties of the sensors. Methods described herein may be advantageous in glass substrate manufacturing processes because uniformity in glass lithography capabilities is limited. As a further advantage, glass very low thermal conductivity and so a glass substrate is a very good thermal insulator; by manufacturing thin structures separating a bolometer pixel from a glass substrate, embodiments herein may better serve to thermally isolate the glass bolometer pixel from the packaging environment.

Method 1200 includes Step 1214, attachment of a readout integrated circuit (ROIC) and flex/PCB attachment. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed for sensing a specific electromagnetic wavelength (such as X-Rays, THz, LWIR).

Figure 13:
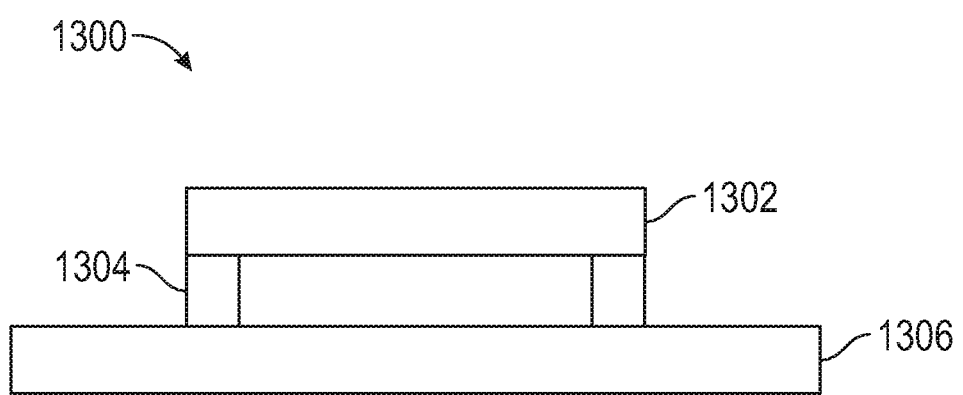
FIG. 13 illustrates a bolometer, in accordance with an embodiment.

In some embodiments, bolometer 1300 is manufactured using method 1200. FIG. 13 illustrates an exemplary bolometer. Bolometer 1300 includes glass substrate 1306, structure 1304 less than 250 nm wide coupled to glass substrate 1306, and a bolometer pixel 1302 coupled to the structure 1304. In some embodiments of bolometer 1300, structure 1304 is a hinge that thermally separates the active area from the glass.

In some embodiments, a bolometer includes a glass substrate, a structure manufactured from any of the methods described herein and coupled to the glass substrate, and a bolometer pixel coupled to the structure.

In some embodiments, a bolometer includes a MEMS or NEMS device manufactured by a LCD-TFT manufacturing process and a structure manufactured by any of the methods described herein. In some embodiments, the structure is the etch stop portion described herein.

Bolometers can be used in a variety of applications. For example, long wave infra-red (LWIR, wavelength of approximately 8-14 μm) bolometers can be used in the automotive and commercial security industries. For example, LWIR bolometers with QVGA, VGA, and other resolution. Terahertz (THz, wavelength of approximately 1.0-0.1 mm) bolometers can be used in security (e.g., airport passenger security screening) and medical (medical imaging). For example, THz bolometers with QVGA resolution and other resolutions. Some electrochemical systems can include X-Ray sensors or camera systems. Similarly, LWIR and THz sensors are used in camera systems. Some electromechanical systems are applied in medical imaging, such as endoscopes and exoscopes.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

In one aspect, a method of manufacturing MEMS products includes: providing glass spacers; providing a window plate; attaching the window plate to the glass spacers; aligning the glass spacers with a MEMS device glass plate; bonding the glass spacers to the MEMS device glass plate; and singulating the glass spacers, window plate, and MEMS device glass plate to produce the MEMS products.

In some aspects of the above method, the MEMS device glass plate and the window plate each measure at least 750 mm by 620 mm.

In some aspects of each of the above methods, the window plate is sufficiently thick and stiff to provide structural support.

In some aspects of each of the above methods, providing a window plate includes depositing an anti-reflective coating on the glass spacers and coupling a wavelength-specific transmissive window to the anti-reflective coating.

In some aspects of each of the above methods, depositing the anti-reflective coating includes thin-film depositing at least two layers with different refractive indexes. In some aspects, evaporated silicon is deposited to form the transmissive window. This technique may advantageously allow for deposition rates up to 1 μm/sec and deposit high quality films with low contamination. In some aspects, the surface is textured with small grooves or notches to form a graded index layer to reduce reflections. The depth and size of the notches may be similar to the desired transmission wavelength. In some aspects of each of the above methods, providing glass spacers includes: providing a glass substrate; and forming the glass spacers from the glass substrate, and depositing the anti-reflective coating precedes forming the glass spacers from the glass substrate.

In some aspects of each of the above methods, providing glass spacers includes: providing a glass substrate; and forming the glass spacers from the glass substrate. In some aspects of each of the above methods, attaching a window plate to the glass spacers includes attaching the window plate to the glass substrate before forming the glass spacers from the glass substrate. In some aspects of each of the above methods, the glass substrate includes a photo sensitive glass substrate and forming the glass spacers includes structurally modifying sections of the glass substrate and then removing the structurally modified sections. In some aspects of each of the above methods, providing glass spacers includes placing a mask on the glass substrate and removing non-masked sections.

In some aspects of each of the above methods, providing the window plate includes attaching silicon wafers to the glass spacers. In some aspects of each of the above methods, the silicon wafers include single crystal silicon. In some aspects of each of the above methods, attaching silicon wafers to the glass spacers includes distributing the silicon wafers on the glass spacers and bonding the silicon wafers to the glass spacers. In some aspects of each of the above methods, the silicon wafers include an antireflective coating.

In some aspects of each of the above methods, providing the glass spacers and providing the window plate includes etching an array of wells in a plurality of silicon wafers. In some aspects of each of the above methods, attaching the window plate to the glass spacers and aligning the glass spacers with a MEMS device glass plate includes: coupling a release layer to a handling plate; coupling, to the release layer, the plurality of silicon wafers so that the array of wells is distal to the release layer; and coupling, to the MEMS device glass plate, the plurality of silicon wafers so that the array of wells is proximal to the MEMS device glass plate. In some aspects of each of the above methods, bonding the glass spacers to the MEMS device glass plate includes bonding the plurality of silicon wafers to the MEMS device glass plate. In some aspects of each of the above methods, singulating the glass spacers, window plate, and MEMS device glass plate to produce the MEMS products includes: decoupling the release layer from the plurality of silicon wafers; and singulating the MEMS products from the bonded MEMS device and plurality of silicon wafers. In some aspects of each of the above methods, the silicon wafer is single crystal silicon.

In some aspects of each of the above methods, bonding the glass spacers to the MEMS device glass plate includes adding solder to the glass spacers on a surface distal to the window plate.

In some aspects of each of the above methods, bonding the glass spacers to the MEMS device glass plate includes:

placing the window plate and MEMS device glass plate in a vacuum environment; and increasing temperature in the vacuum environment.

In some aspects of each of the above methods, the method further includes: depositing a getter material on the glass spacers and window plate; and dry-etching the getter material from the window plate.

As used herein, the term "MEMS" can be understood to include electromechanical systems having sizes of approximately 1 mm and below. For example, the term "MEMS" can be understood to include nano electromechanical systems.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims. For example, although this disclosure is primarily described with respect to glass MEMS plates/panels, one of skill in the art will recognize that other MEMS plates/panels could also be used without deviating from the scope of the disclosure. Such others MEMS plates may include, but are not limited to, organic materials (plastics, polymers) and metals (e.g., stainless steel). As used herein, the terms "plate" and "panel" are synonymous.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A method of manufacturing microelectromechanical systems ("MEMS") products comprising:
   providing glass spacers;
   depositing an anti-reflective coating on the glass spacers;
   coupling a wavelength-specific transmissive window to the anti-reflective coating;
   providing a window plate;
   attaching the window plate to the glass spacers;
   aligning the glass spacers with a MEMS device glass plate;
   bonding the glass spacers to the MEMS device glass plate; and
   singulating the glass spacers, window plate, and MEMS device glass plate to produce the MEMS products.

2. The method of claim 1, wherein the MEMS device glass plate and the window plate each measure at least 750 mm by 620 mm.

3. The method of claim 1, wherein the window plate is sufficiently thick and stiff to provide structural support.

4. The method of claim 1, wherein depositing the anti-reflective coating comprises thin-film depositing at least two layers with different refractive indexes.

5. The method of claim 1, wherein providing the window plate comprises thin-film depositing a wavelength-specific transmissive window.

6. The method of claim 1, wherein providing the glass spacers comprises:
   providing a glass substrate; and
   forming the glass spacers from the glass substrate, wherein depositing the anti-reflective coating precedes forming the glass spacers from the glass substrate.

7. The method of claim 1, wherein providing the glass spacers comprises:
   providing a glass substrate; and
   forming the glass spacers from the glass substrate.

8. The method of claim 7, wherein attaching the window plate to the glass spacers comprises attaching the window plate to the glass substrate before forming the glass spacers from the glass substrate.

9. The method of claim 6, wherein the glass substrate comprises a photo sensitive glass substrate and wherein forming the glass spacers comprises structurally modifying sections of the glass substrate and then removing the structurally modified sections.

10. The method of claim 6, wherein providing the glass spacers comprises placing a mask on the glass substrate and removing non-masked sections.

11. The method of claim 1, wherein providing the window plate comprises attaching a silicon wafer to the glass spacers.

12. The method of claim 11, wherein the silicon wafer comprises single crystal silicon.

13. The method of claim 11, wherein attaching the silicon wafer to the glass spacers comprises distributing the silicon wafer on the glass spacers and bonding the silicon wafer to the glass spacers.

14. The method of claim 11, wherein the silicon wafer comprises an anti-reflective coating.

15. A method of manufacturing MEMS products comprising:
   providing glass spacers;
   providing a window plate;
   attaching the window plate to the glass spacers;
   aligning the glass spacers with a MEMS device glass plate;
   bonding the glass spacers to the MEMS device glass plate; and
   singulating the glass spacers, window plate, and MEMS device glass plate to produce the MEMS products,
   wherein providing the glass spacers and providing the window plate comprises etching an array of wells in a plurality of silicon wafers,
   wherein attaching the window plate to the glass spacers and aligning the glass spacers with a MEMS device glass plate comprises:
      coupling a release layer to a handling plate;
      coupling, to the release layer, the plurality of silicon wafers so that the array of wells is distal to the release layer; and
      coupling, to the MEMS device glass plate, the plurality of silicon wafers so that the array of wells is proximal to the MEMS device glass plate;
   wherein bonding the glass spacers to the MEMS device glass plate comprises bonding the plurality of silicon wafers to the MEMS device glass plate, and
   wherein singulating the glass spacers, window plate, and MEMS device glass plate to produce the MEMS devices comprises:

decoupling the release layer from the plurality of silicon wafers; and singulating the MEMS products from the bonded MEMS device and plurality of silicon wafers.

16. The method of claim 15, wherein the silicon wafer is single crystal silicon.

17. The method of claim 1, wherein bonding the glass spacers to the MEMS device glass plate comprises adding solder to the glass spacers on a surface distal to the window plate.

18. A method of manufacturing MEMS products comprising:

providing glass spacers;

providing a window plate;

attaching the window plate to the glass spacers;

aligning the glass spacers with a MEMS device glass plate;

bonding the glass spacers to the MEMS device glass plate;

singulating the glass spacers, window plate, and MEMS device glass plate to produce the MEMS products;

depositing a getter material on the glass spacers and window plate; and dry-etching the getter material from the window plate.

19. The method of claim 1, wherein bonding the glass spacers to the MEMS device glass plate comprises:

placing the window plate and MEMS device glass plate in a vacuum environment; and increasing temperature in the vacuum environment.

* * * * *